United States Patent [19]
Fritz

[11] Patent Number: 5,744,383
[45] Date of Patent: Apr. 28, 1998

[54] INTEGRATED CIRCUIT PACKAGE FABRICATION METHOD

[75] Inventor: Donald S. Fritz, San Jose, Calif.

[73] Assignee: Altera Corporation, San Jose, Calif.

[21] Appl. No.: 560,362

[22] Filed: Nov. 17, 1995

[51] Int. Cl.⁶ .................................................. H01L 21/60
[52] U.S. Cl. ........................... 438/111; 438/112; 438/125
[58] Field of Search ..................................... 438/111, 112, 438/118, 119, 121, 124, 125, 126, 127

[56] References Cited

U.S. PATENT DOCUMENTS

| | | | |
|---|---|---|---|
| 4,870,224 | 9/1989 | Smith et al. | 174/52.4 |
| 5,068,714 | 11/1991 | Seipler | 438/119 |
| 5,126,818 | 6/1992 | Takami et al. | 438/125 |
| 5,249,101 | 9/1993 | Frey et al. | 438/126 |
| 5,346,857 | 9/1994 | Scharr et al. | 438/125 |
| 5,381,039 | 1/1995 | Morrison | 257/701 |
| 5,438,020 | 8/1995 | Grancher et al. | 438/125 |
| 5,534,467 | 7/1996 | Rostoker | 438/125 |

FOREIGN PATENT DOCUMENTS 0 210 371 A1  2/1987  European Pat. Off. .

OTHER PUBLICATIONS

Corporate Profile, Shinko Electric Industries Co., Ltd., Nagano–Shi, Japan (undated).

"Tape Automated Bonding (TAB), Preliminary Data, Family Code: TP7," Technology Products, IBM, Armonk, New York, Jan. 11, 1993.

"Area Array TAB Packaging (ATAB), Preliminary Data, Family Code: TP7," Technology Products, IBM, Armonk, New York, Jan. 13, 1993.

"C–4 Solder Chip Connection, Preliminary Data," Technology Products, IBM, Armonk, New York, Jan. 8, 1993.

"TAB Interposer Enables Dramatic Die Cost Reduction Using Standard Packages," Swire Technologies, Hong Kong (undated).

"Solder Bumping Flow," APTOS Corporation, Milpitas, California (undated).

"Wafer Bumping Service," Brochure of APTOS Corporation, Milpitas, California (undated).

"Standard Procedures and Practices," JEDEC Standard 95–1, pp. 3–7 to 3–10, Jun. 20, 1991.

"Metric Plastic Quad Flat Pack Family 3.2mm Footprint," JEDEC Publication No. 95, JEDEC Solid State Product Outlines, Issue A, pp. 1–24, Oct., 1990.

"TapePak® Molded Carrier Ring Family," JEDEC Solid State Product Outlines, Issue B, pp. 1 and 2, Mar., 1993.

"Metric Tape Automated Bonding (TAB) Tape Carrier Family," JEDEC Solid State Product Outline, Issue A, pp. 1–10, Nov., 1993.

"Tape Automated Bonding (TAB) Package Family (S–PQUC–X/TAB)," JEDEC Solid State Product Outline, Issue B, pp. 1–23, Nov., 1993.

*Primary Examiner*—Kevin Picardat
*Attorney, Agent, or Firm*—Fish & Neave; Robert R. Jackson; G. Victor Treyz

[57] ABSTRACT

A leadframe integrated circuit package is provide with an interposer structure for electrically interconnecting a die with the leadframe. The interposer has a rigid substrate, which is mounted in the leadframe in place of a conventional integrated circuit die. Interposer bonding pads at the periphery of the substrate are connected to bond fingers of the leadframe, e.g., by wire bonding. The interposer bonding pads are electrically connected to the die using a network of routing lines connected to a central array of interposer array pads. The array of interposer array pads is connected to a corresponding array of die array pads on the die using metal bumps.

17 Claims, 10 Drawing Sheets

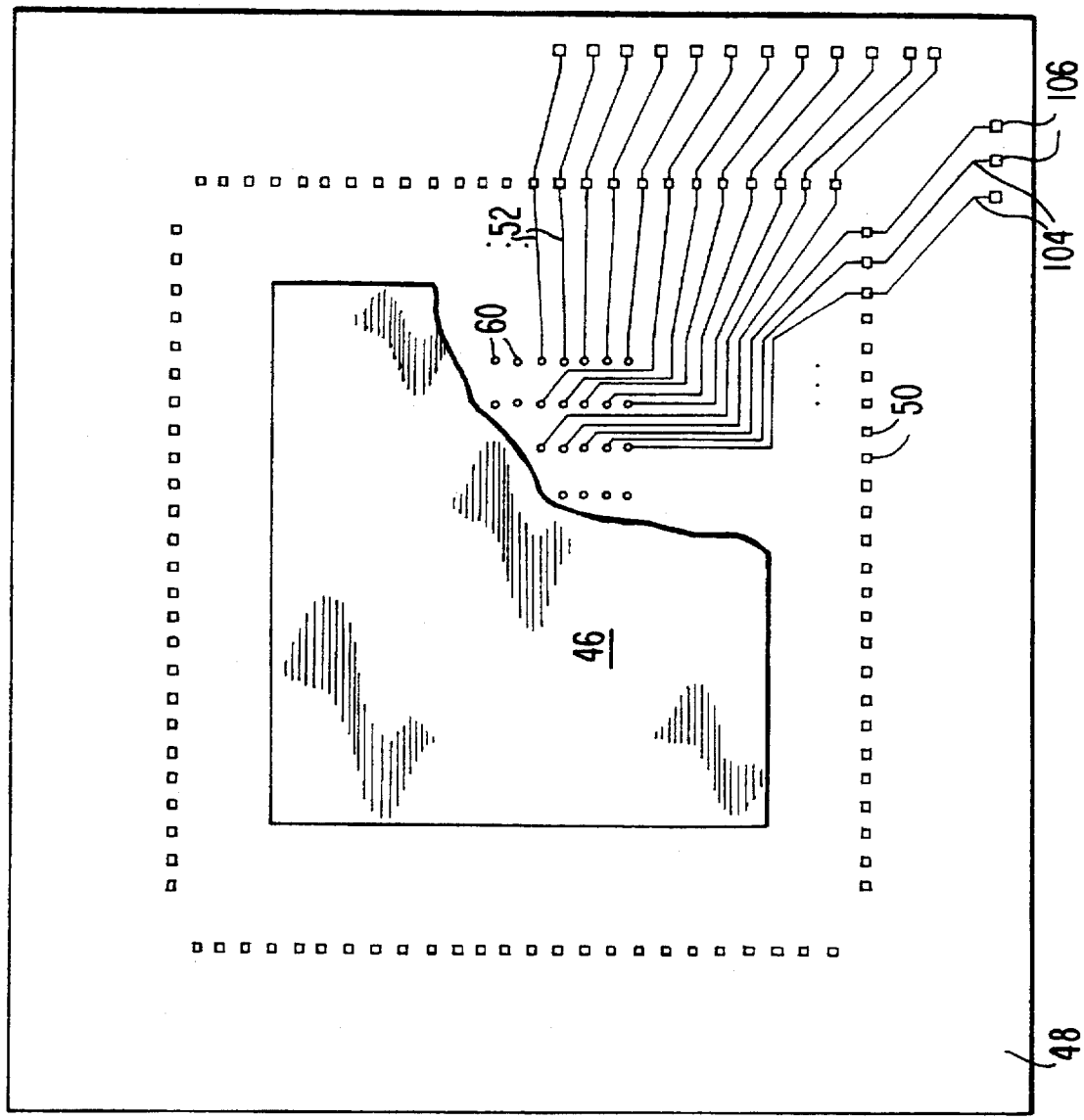

INTEGRATED CIRCUIT PACKAGE FABRICATION METHOD

BACKGROUND OF THE INVENTION

This invention relates to semiconductor integrated circuit packaging techniques, and more particularly, to integrated circuit packaging techniques that allow smaller and denser integrated circuit chips to be packaged using standard leadframes.

Integrated circuit die are typically packaged prior to assembling an integrated circuit in an electronic system. Certain plastic packages, such as the quad flat package, contain an internal support structure known as a leadframe. Leadframes have metal prongs that are used to form the pins of the package. In the center of a leadframe, the tips of the prongs (called bond fingers) are wire bonded to bonding pads on the die. After the leadframe bond fingers are connected to the bonding pads, the die and leadframe are encapsulated within the plastic package.

There is a continual improvement in integrated circuit fabrication techniques, which creates a need to accommodate integrated circuits of increasing density and complexity. Some integrated circuits use a smaller die size for a given number of bonding pads. Other circuits use a greater number of bonding pads for a die of a given size. However, conventional techniques for packaging die in the leadframes of plastic packages are impractical for die with many bonding pads per die area. For example, when a die becomes too small, it is no longer possible for the bond fingers to extend inwardly from the edges of the leadframe as much as they should. Further, with conventional packaging techniques, bonding pads must be arranged around the periphery of the die and must have a minimum size and center-to-center spacing to allow bonding wires to be attached properly. It is therefore not possible to shrink the size of many integrated circuit die, because it is necessary to provide space about the periphery of the die for the bonding pads. Although some packaging schemes have attempted to provide more connections to a die by using arrays of solder balls rather than peripheral bonding pads, such schemes have generally been limited to mounting die on printed circuit boards with tape automated bonding (TAB) films, rather than mounting die in plastic leadframe packages.

It is therefore an object of the present invention to provide an improved integrated circuit packaging technique that allows integrated circuit dies with a high density of bonding pads to be mounted in leadframe packages.

It is a further object of the present invention to provide an interposer for connecting a die to the bond fingers of a leadframe.

It is also an object of the present invention to provide an interposer structure that is formed from a wafer of rigid substrate material so that die mounted on the substrate wafer can be probe tested using industry standard step-and-repeat wafer testers.

SUMMARY OF THE INVENTION

These and other objects of the invention are accomplished in accordance with the principles of the present invention by providing a leadframe integrated circuit package with an interposer structure for electrically interconnecting a die with the leadframe. The interposer has a rigid substrate, which is mounted on the leadframe in place of a conventional integrated circuit die. Interposer bonding pads at the periphery of the substrate are connected to the bond fingers of the leadframe. The interposer bonding pads are electrically connected to a central array of interposer array pads by a network of routing lines. The array of interposer array pads mates with a corresponding array of die array pads using metal bumps. The die array pads can be connected directly to the circuitry on the die, or can be connected to the die circuitry via a network of die routing lines. An advantage of this arrangement is that the array of die array pads can contain many more electrical connections per unit area than provide by conventional peripheral bonding pad schemes. Further, the rigidity of the interposer substrate and the spacing of the interposer bonding pads allow industry-standard step-and-repeat wafer test probe equipment to be used to probe the substrate for testing the individual die before they are mounted in the leadframes.

Further features of the invention, its nature and various advantages will be more apparent from the accompanying drawings and the following detailed description of the preferred embodiments.

BRIEF DESCRIPTION OF THE DRAWINGS

FIG. 11 is a plan view of an illustrative interposer substrate on which routing lines have been extended to form areas suitable for bonding directly to the bond fingers of a leadframe in accordance with the present invention.

DETAILED DESCRIPTION OF THE PREFERRED EMBODIMENTS

Integrated circuit chips must be suitably packaged before being used in electronic systems. Common industry-standard plastic packages, such as the quad flat package, provide integrated circuits with a sealed housing that protects the circuits from damage and allows the circuits to be handled while being mounted on printed circuit boards.

Figure 1:
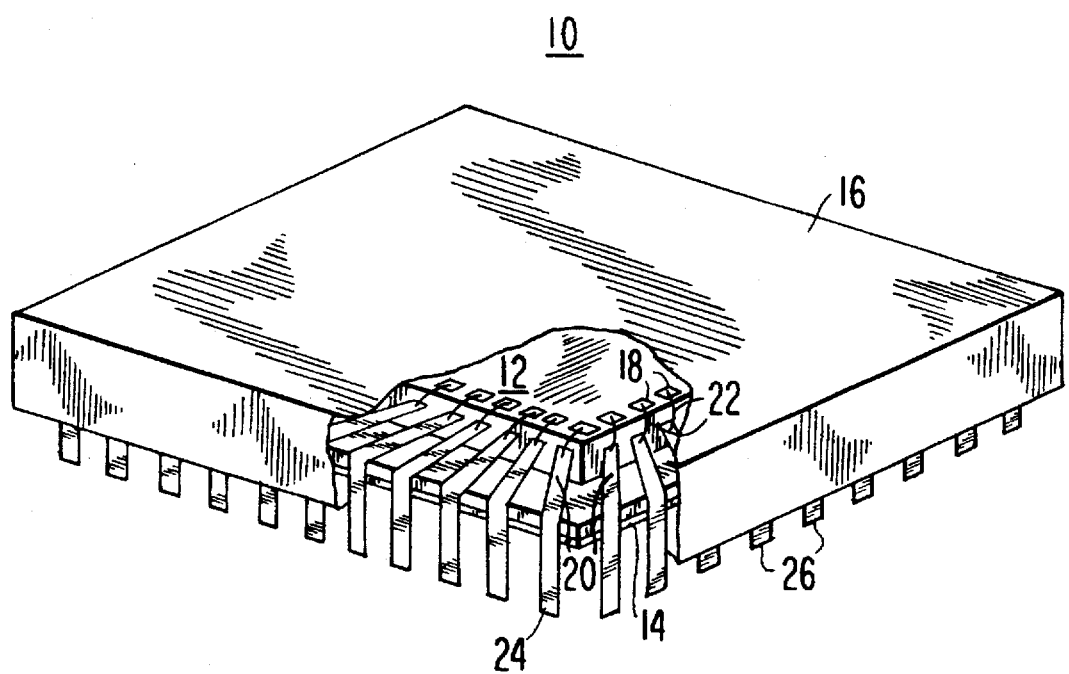
FIG. 1 is a partly sectional perspective view of a conventional quad flat package containing a leadframe.

A conventional packaged integrated circuit 10 is shown in FIG. 1. Integrated circuit die 12 is mounted on leadframe 14 and encapsulated in a plastic housing 16. Circuitry (not shown) on the surface of die 12 is connected to peripheral bonding pads 18, through which signals are routed to and from die 12. Bonding pads 18 are electrically connected to bond fingers 20 with bond wires 22. In order to properly connect bond wires 22, bonding pads 18 must be arranged around the periphery of die 12. Bond fingers 20 are formed from the inner portion of metal prongs 24 of leadframe 14. The outer portions of metal prongs 24 are bent downward during the construction of packaged integrated circuit 10 to form pins 26.

As integrated circuits shrink in size and grow more complex, it is becoming desirable to provide an increasing number of bonding pads 18 for a die 12 of a given size. However, the wire bonding equipment (e.g., for 1.3 mil gold wire bonding) that is currently used to attach bond wires 22 between bonding pads 18 and bond fingers 20 cannot form wire bonds if the center-to-center pitch of bonding pads 18 is less than about 3 mils (75 µm). The testing equipment used to probe bonding pads 18 of die 12 while die 12 is in wafer form also requires a minimum center-to-center pitch of about 3 mils. As a result, the minimum acceptable size for a die is often limited by the need to provide sufficient space for bonding pads 18. Integrated circuit designs whose minimum die size are limited by bonding pad requirements are said to be "bonding pad limited."

Figure 2:
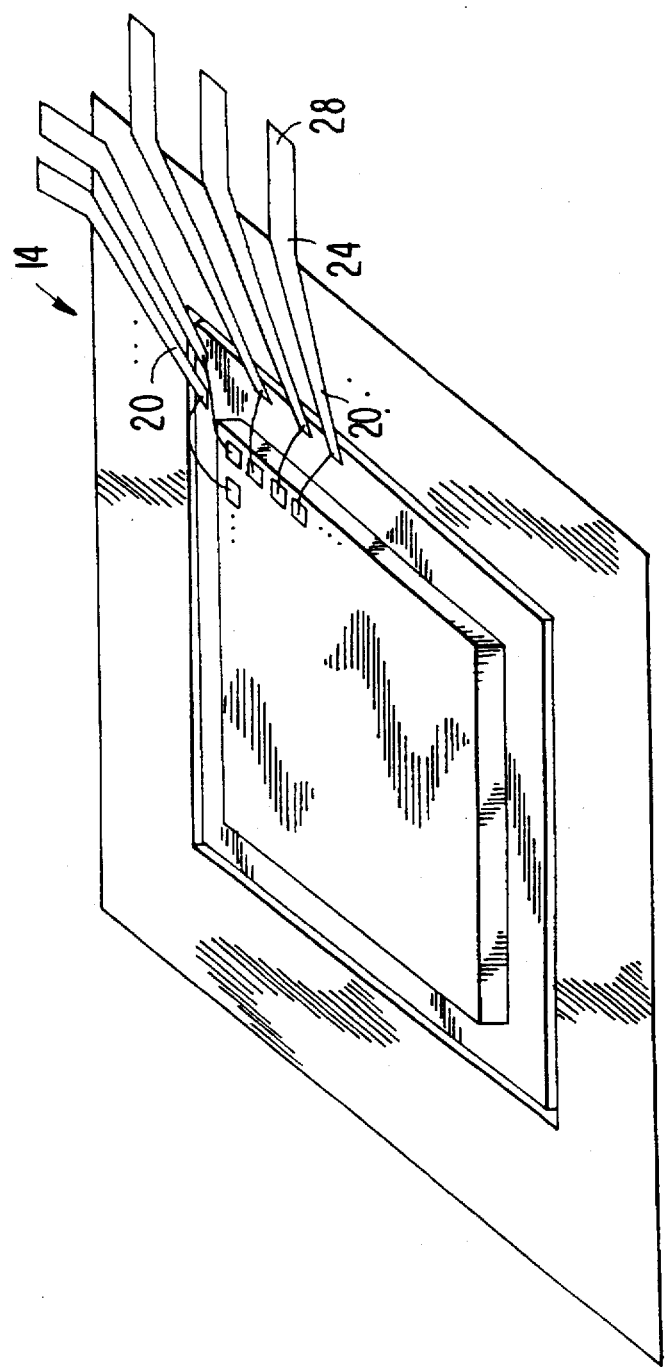
FIG. 2 is a perspective view of a conventional leadframe structure.

Another limitation on the minimum acceptable size for die 12 results from the design of leadframe 14. The outer portions 28 of prongs 24 must be sufficiently large to form pins 26 (FIG. 1), whereas the inner portions of prongs 24 that make up bond fingers 20 must not come into contact with one another to prevent shorting. Accordingly, bond fingers 20 are tapered, becoming narrower as they extend toward the center of leadframe 14, as shown in FIG. 2. However, bond fingers 20 must be wide enough at the center of leadframe 14 to allow the attachment of bond wires 22 without being damaged. Bond fingers 20 also cannot be lengthened indefinitely because they will be susceptible to bending. As a result, a leadframe 14 with a given number of bond fingers 20 cannot accommodate dies below a certain minimum size using the arrangement of FIG. 2.

Figure 3:
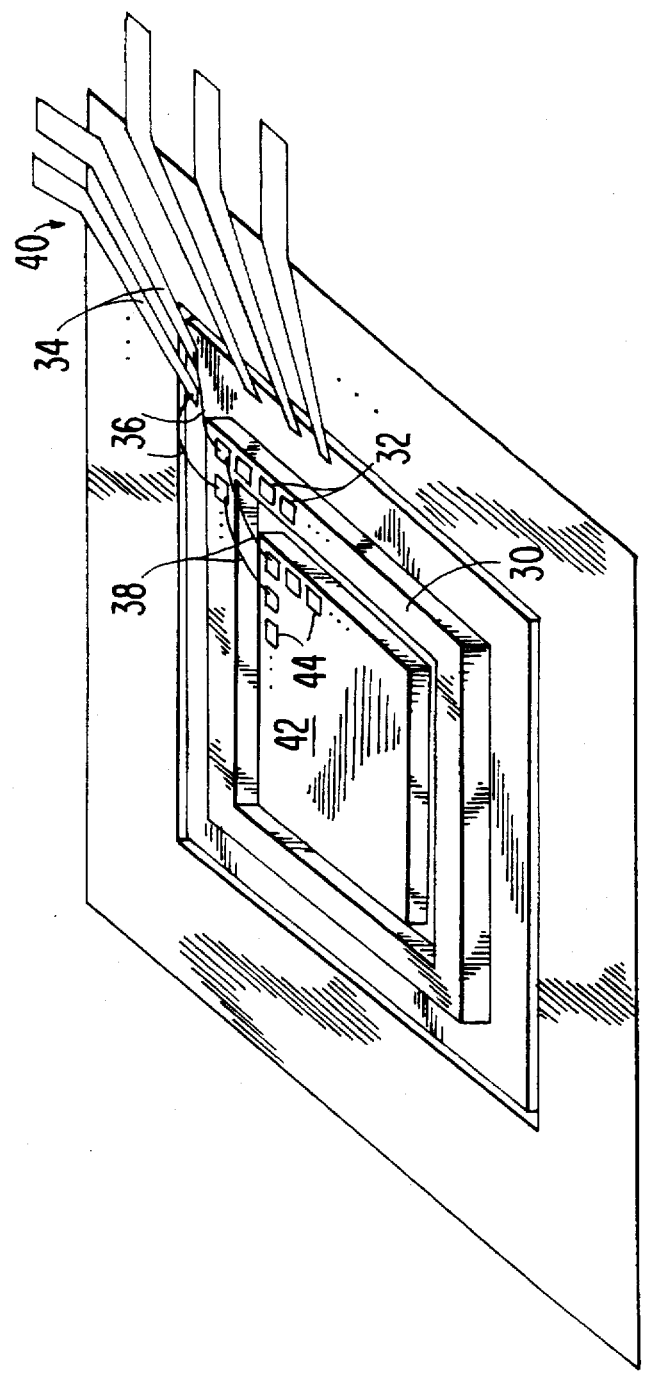
FIG. 3 is a perspective view of a leadframe structure using a conventional interposer.

One packaging configuration that has been used to accommodate small dies in leadframe packages is shown in FIG. 3. Interposer 30 is provided as an intermediate structure between leadframe 40 and die 42. Interposer 30 has paths 32, to which bond fingers 34 are connected by bond wires 36 at the periphery of interposer 30. Bond wires 38 are connected between bonding pads 44 on die 42 and the inner portions of paths 32 on interposer 30. Because the inner portions of paths 32 may be more closely spaced than the inner portions of bond fingers 34 and because interposer 30 alleviates the need to extend bond fingers 34 further inward, the configuration of FIG. 3 allows smaller dies to be connected to leadframe 40 than would otherwise be possible. However, forming the numerous wire bonds between die 42, interposer 30, and leadframe 40 can be cumbersome. Further, the electrical connections to die 42 are made by attaching bond wires 38 to bonding pads 44, which must therefore be spaced using a standard center-to-center pitch. As a result, the use of interposer 30 in the configuration of FIG. 3 does not allow integrated circuit designs that are bonding pad limited to be implemented using a smaller die size.

Figure 4:
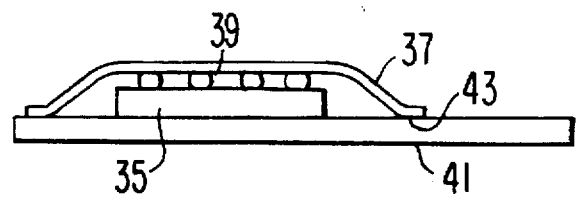
FIG. 4 is a cross-sectional view of an integrated circuit die mounted to a printed circuit board using a conventional tape automated bonding mounting technique.

A configuration that has been used to mount small dies with complex circuitry on printed circuit boards is shown in FIG. 4. Die 35 is connected to tape automated bonding (TAB) tape 37 by an array of solder bumps 39. Metal traces (not shown) on tape 37 interconnect solder bumps 39 with metal lines (not shown) on the surface of printed circuit board 41 at interconnection points 43. The TAB mounting technique of FIG. 4 allows high-density die to be mounted on printed circuit boards, but has not been applied to leadframe packages. TAB mounting of die also involves the use of specialized test probes for probing the array of solder bumps on die 35 prior to attaching die 35 to tape 37.

Figure 8:
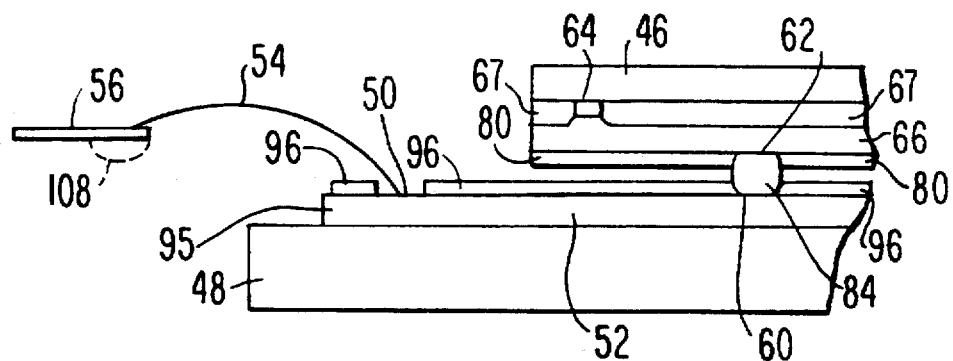
FIG. 8 is a cross-sectional view of an illustrative die and interposer structure shown connected to a leadframe bond finger in accordance with the present invention.
Figure 5:
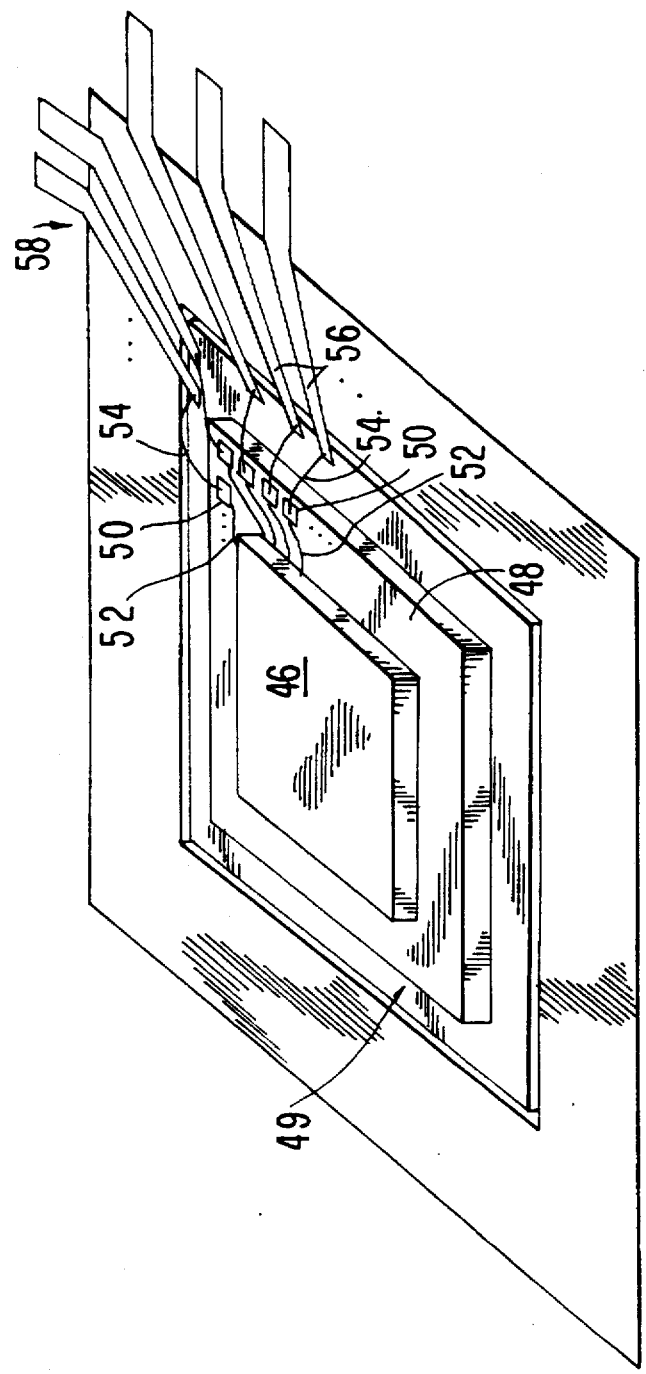
FIG. 5 is a perspective view of an illustrative packaging structure of the present invention.

Integrated circuit packaging in accordance with the present invention is shown in FIG. 5. Integrated circuit die 46 is mounted on substrate 48 of interposer 49. The top surface of die 46 faces downward. Circuitry 45 (FIG. 7) on the top surface of die 46 is connected to interposer 49 using metal bumps 64 (FIG. 8). Interposer routing lines 52 on the surface of substrate 48 electrically interconnect metal bumps 64 (FIG. 8) with the interposer bonding pads 50, which are formed at the periphery of substrate 48. Interposer bonding pads 50 are preferably spaced with a pitch of about 4.3 mils center-to-center and are connected to bond fingers 56 of leadframe 58 with bond wires 54. In order to complete the package of FIG. 5, die 46, substrate 48, and leadframe 58 are preferably mounted within a conventional plastic housing of the type shown in FIG. 1.

Figure 6:
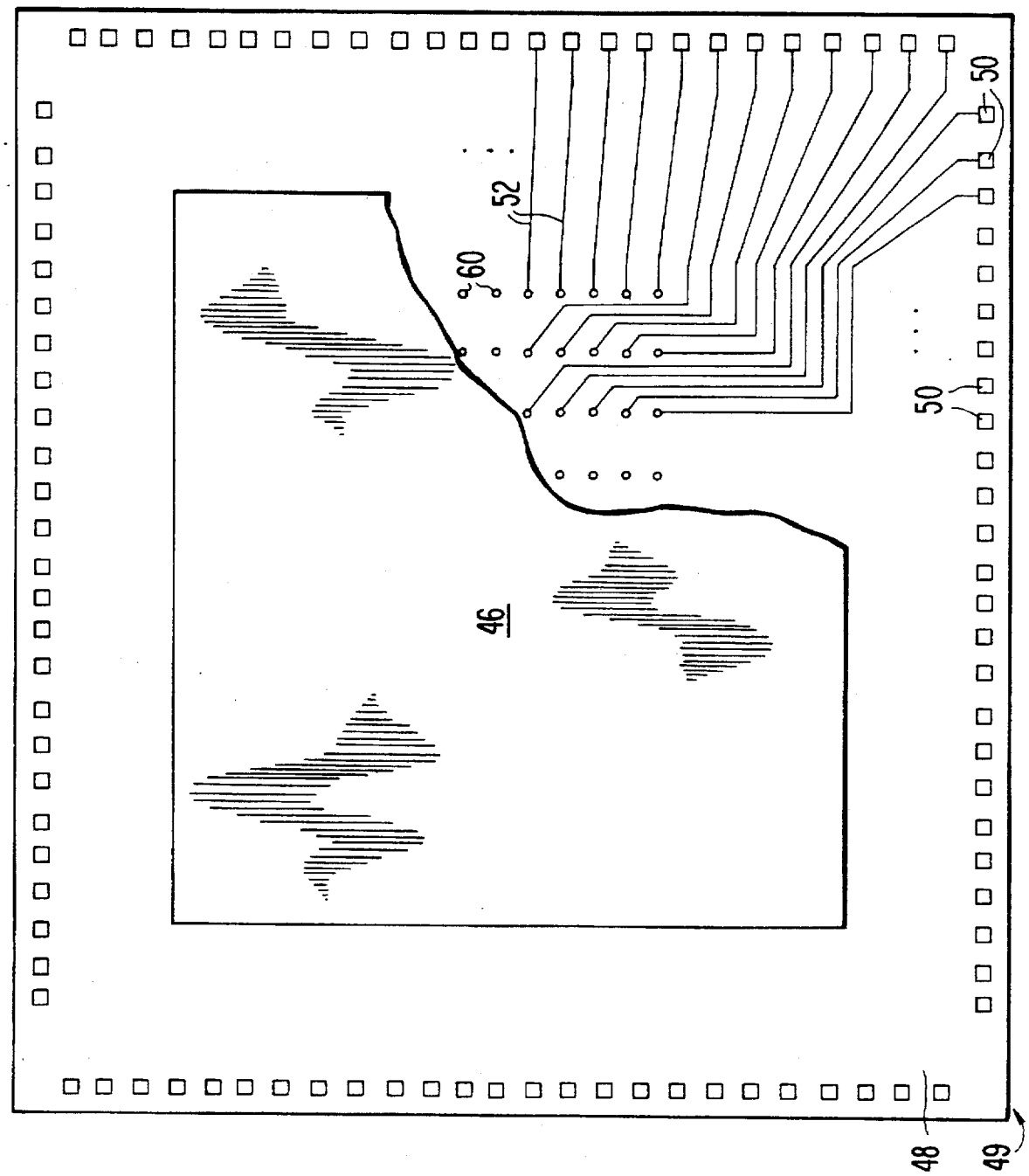
FIG. 6 is a partly sectional plan view of an illustrative interposer on which a die has been mounted in accordance with the present invention.

In order to provide a high density of interconnection points between die 46 and substrate 48, the metal bumps 64 (FIG. 8) that are used to connect the circuitry on the surface of die 46 to the substrate 48 of interposer 49 are preferably provided in an the form of an array. As shown in FIG. 6, interposer substrate 48 has an array of interposer array pads 60 connected to interposer bonding pads 50 by interposer routing lines 52. Suitable interposer array pads 60 are about 10 mils square and are formed with a pitch of about 5–12 mils center-to-center (preferably 12 mils). Interposer array pads 60, routing lines 52, and interposer bonding pads 50 are preferably formed from a 1500 µm to 2000 µm layer of aluminum or gold. If desired, a passivation layer of polyimide or other suitable insulator may be formed on the surface of substrate 48 with openings for interposer bonding pads 60. About 400 interposer array pads 60 can be provided on a typical substrate at a 12 mil pitch using a single-layer metallization scheme. A greater number of interposer array pads 60 may be provided if more than one layer of metal is used to form interposer routing lines 52.

Figure 7:
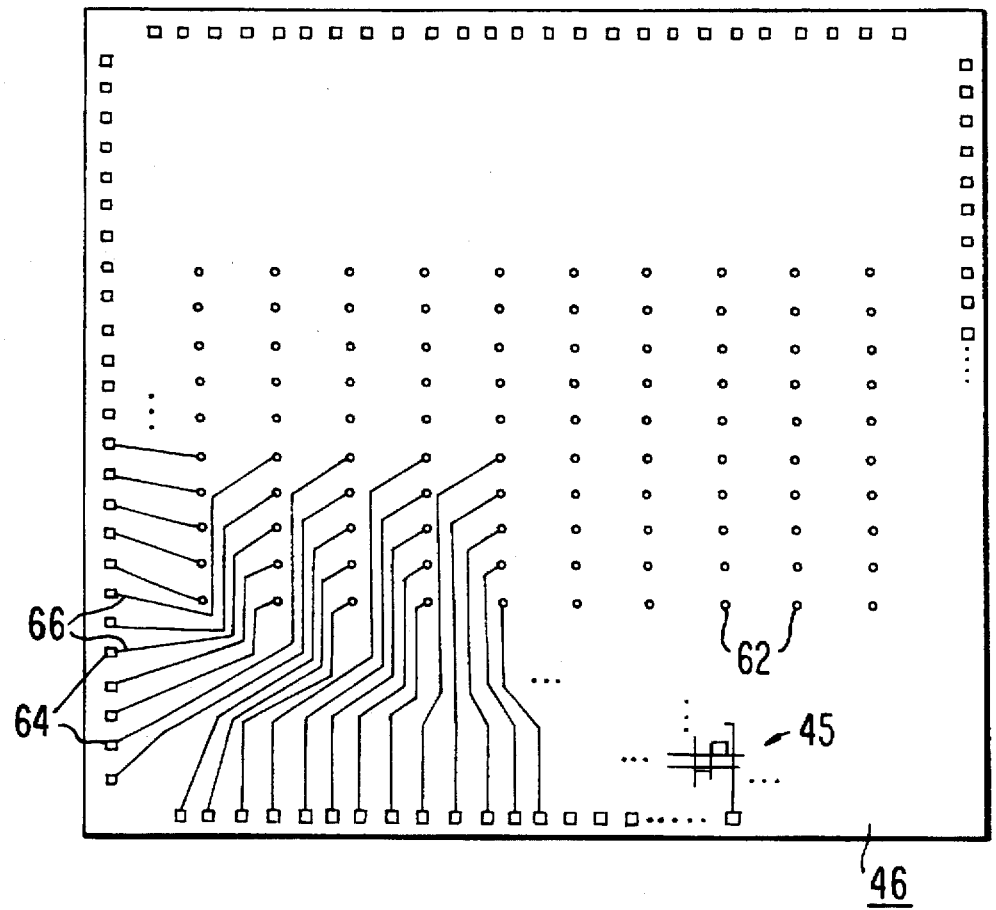
FIG. 7 is a plan view of an illustrative die configuration showing die routing lines in accordance with the present invention.

As shown in FIG. 7, die 46 preferably has an array of die array pads 62 that are configured to mate with the interposer array pads 60 (FIG. 6) when the die 46 is mounted face down on the surface of substrate 48. If desired, die array pads 62 may take the place of a die's usual bonding pads, so that circuitry 45 on the surface of die 46 is directly connected to die array pads 62. If it is desired to package a die 46 of a design in which circuitry 45 is arranged to route signals to peripheral die bonding pads 64, die routing lines 66 may be provided to route the signals from die bonding pads 64 to die array pads 62 in the center of die 46.

Figure 9:
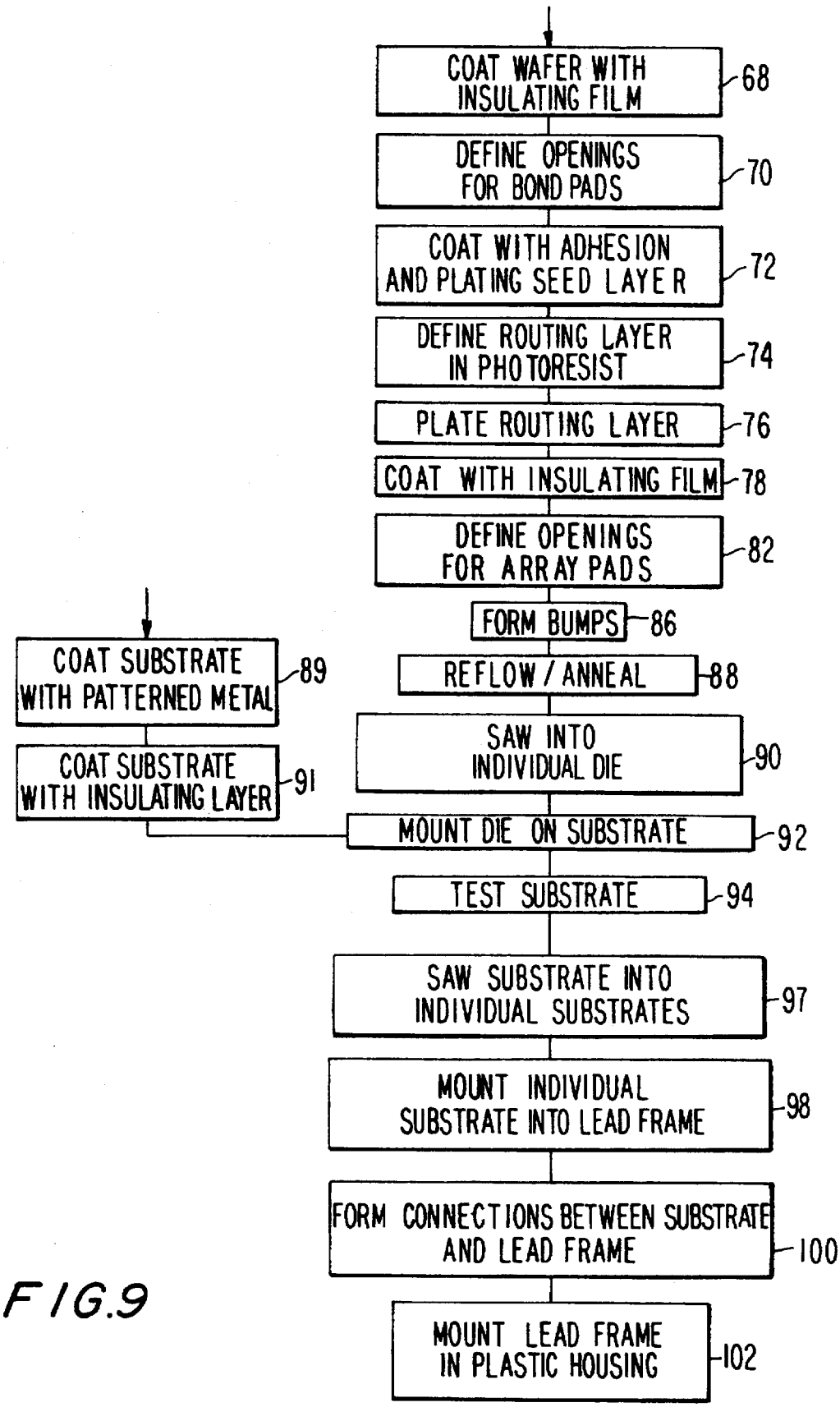
FIG. 9 is a flow chart of illustrative steps for constructing the integrated circuit package of the present invention.

A cross section of an illustrative packaging structure formed in accordance with the present invention is shown in FIG. 8 and the steps involved in forming this structure are shown in FIG. 9. Following integrated circuit fabrication, a silicon wafer containing die 46 is encapsulated with a silicon nitride layer having openings at die bonding pads 64. The wafer of die 46 is coated with insulating film 67, such as a polyimide film, at step 68. At step 70, openings are formed in insulating film 67 to expose die bonding pads 64. At step 72, the wafer is coated with an adhesion and plating seed layer, preferably of titanium and copper. A layer of photoresist is patterned to define the desired pathways for die routing lines 66 at step 74. Die routing lines 66 are formed by electroplating the wafer (e.g., with gold or copper) at step 76. Each die routing line 66 is connected to a respective one of die bonding pads 64.

After forming die routing lines 66, the wafer of die 46 is coated with an insulating film 80 (preferably a polyimide film) at step 78. At step 82, openings are formed in insulating film 80 at appropriate locations to define die array pads 62. Bumps 84 of solder or gold are formed at step 86 by forming a bump masking layer with openings at die array pads 62 and by using conventional evaporation or plating techniques. At step 88, bumps 84 are reflowed (if bumps 84 are solder) or annealed (if bumps 84 are gold). Following step 88, an entire wafer of die 46 has been formed with an array of bumps 84 on die array pads 62. The wafer is sawed into individual die 46 at step 90.

Figure 10:
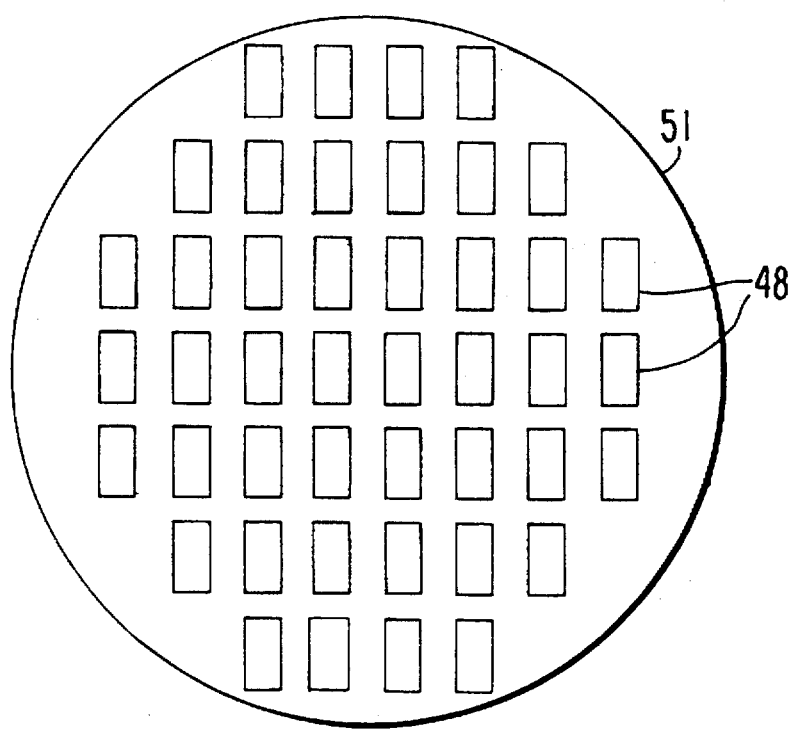
FIG. 10 is a plan view of a wafer of the interposer substrates of the present invention.

At step 92, individual die 46 are mounted onto wafer 51 (FIG. 10) of individual interposer substrates 48 using a combination of heat and ultrasonic bonding (if bumps 84 are gold) or by reflowing bumps 84 (if bumps 84 are solder). Wafer 51 (FIG. 10) may have any suitable shape (e.g., round or square) that allows handling of multiple substrates 48. Handling and testing are also facilitated by forming wafers 51 of a rigid material. Suitable substrate materials include diamond, silicon, ceramic, or doped glass. Prior to step 92, wafer 51 (FIG. 10) of substrates 48 is prepared at step 89 by coating wafer 51 with a patterned aluminum or gold metallization layer 95. Metallization layer 95 forms interposer array pads 60, interposer routing lines 52 (in the case of a single level metallization), and interposer bonding pads 50. Metallization layer 95 is preferably covered with insulating layer 96 (e.g., polyimide) with openings to define interposer array pads 60 and interposer bonding pads 50, at step 91. If desired, metallization layer 95 and insulating layer 96 may be formed by affixing a suitable composite film (e.g., polyimide-backed copper) to wafer 51 and patterning using standard photolithographic techniques.

Once die 46 have been mounted on wafer 51, individual die 46 can be tested at step 94 by probing interposer bonding pads 50. An advantage of the present invention is that using a rigid substrate material for wafer 51 allows conventional industry-standard testing equipment (designed for use with wafers of standard-sized die) to be used to test wafer 51 (FIG. 10) on which individual die 46 have been mounted. Die mounted on TAB tape cannot be tested without using a special carrier, which can make handing such TAB mounted die difficult. Further, multiple integrated circuit designs can be probed and tested using the same configuration, provided that substrates 48 onto which the various die 46 are mounted have a standardized array of interposer bonding pads 50.

Wafer 51 (FIG. 10) is sawed into individual substrates 48 at step 97 and mounted in leadframe 58 (FIG. 5) at step 98 (e.g., using a thermally conductive adhesive). During step 100, electrical connections are formed between interposer bonding pads 50 and bond fingers 56. One suitable technique for forming these connections is by connecting bond wires 54 between interposer bonding pads 50 and bond fingers 56 by conventional wire bonding. Interposer bonding pads 50 can also be connected to bond fingers 56 using TAB tape. If desired, interposer routing lines 52 can be extended by adding extensions 104, as shown in FIG. 11. Extensions 104 can be bonded directly to bond fingers 56 (FIG. 8). The ends of extensions 104 of interposer routing lines 52 can also be enlarged to form pad portions 106, which can also be bonded directly to bond fingers 56 (FIG. 8). If bond fingers 56 are bonded directly to pad portions 106, the underside end portions of bond fingers 56 can be enlarged (shown as dotted outline 108 in FIG. 8) to facilitate the formation of good bonds. After electrical connections between substrate 48 (FIG. 8) and leadframe 58 (FIG. 8) have been formed at step 100, leadframe 58 is encapsulated in a plastic housing at step 102.

The foregoing is merely illustrative of the principles of this invention and various modifications can be made by those skilled in the art without departing from the scope and spirit of the invention.

What is claimed is:

1. A method of integrated circuit packaging comprising the steps of:

providing an integrated circuit die having a top die surface, circuitry on said top die surface, and die array pads on said top die surface connected to said circuitry;

providing a leadframe having a plurality of wire bonding fingers;

providing an interposer having a rigid substrate with a top substrate surface, interposer array pads arranged in a pattern on said top substrate surface for mating with said die array pads when said top die surface faces said top substrate surface, interposer wire bonding pads arranged about the periphery of said top substrate surface, and interposer routing lines for connecting said interposer array pads to said interposer wire bonding pads;

providing metal bumps for forming connections between said die array pads and said interposer array pads;

providing a housing;

electrically connecting said die array pads to said interposer array pads with said metal bumps;

electrically connecting said wire bonding fingers and said interposer wire bonding pads by providing bond wires and by wire bonding said bond wires between said wire bonding fingers and said interposer wire bonding pads; and encapsulating said die, said leadframe, said interposer, said bond, said metal bumps, and said wire bonding fingers in said housing.

2. The method defined in claim 1 further comprising the steps of:

providing extensions to said interposer routing wires; and electrically connecting said extensions to said wire bonding fingers.

3. A method of integrated circuit packaging comprising the steps of:

providing an integrated circuit die having a top die surface, circuitry on said top die surface, and die array pads on said top die surface connected to said circuitry;

providing a leadframe having a plurality of bond fingers;

providing an interposer having a rigid substrate with a top substrate surface, interposer array pads arranged in a pattern on said top substrate surface for mating with said die array pads when said top die surface faces said top substrate surface, interposer bonding pads arranged about the periphery of said top substrate surface, and interposer routing lines for connecting said interposer array pads to said interposer bonding pads;

providing metal bumps for forming connections between said die array pads and said interposer array pads;

providing a housing;

electrically connecting said die array pads to said interposer array pads with said metal bumps;

electrically connecting said bond fingers and said interposer bonding pads;

encapsulating said die, said leadframe, said interposer, said bond, said metal bumps, and said bond fingers in said housing;

providing die bonding pads on said top die surface directly connected to said circuitry; and providing die routing lines on said top die surface between said die bonding pads and said die array pads.

4. The method defined in claim 3 further comprising the step of forming a first insulating film on said die with openings for said die bonding pads.

5. The method defined in claim 4 further comprising the step of forming a second insulating film on said die routing lines with openings for said die array pads.

6. The method defined in claim 1 further comprising the step of providing said die array pads and said interposer array pads in mating rectangular array patterns.

7. The method defined in claim 3 further comprising the step of defining pathways for said die routing lines with photoresist.

8. The method defined in claim 1 further comprising the step of forming a die routing metallization layer on top of said die.

9. The method defined in claim 1 further comprising the steps of:

forming solder bumps on said die array pads; and mounting said die on said substrate by reflowing said solder bumps.

10. The method defined in claim 1 further comprising the steps of:

forming gold bumps on said die array pads; and mounting said die on said substrate by applying heat and ultrasonic bonding.

11. The method defined in claim 1 further comprising the step of mounting said substrate in said lead structure with a conductive adhesive.

12. The method defined in claim 1 further comprising the step of coating said substrate with a patterned metal to form said interposer routing lines.

13. The method defined in claim 1 further comprising the step of forming an insulating layer on top of said interposer routing lines with openings for said interposer array pads and said interposer wire bonding pads.

14. The method defined in claim 1 further comprising the step of forming said rigid substrate from a wafer of substrate selected from the group consisting of: diamond substrate, silicon substrate, ceramic substrate, and doped glass substrate.

15. The method defined in claim 1 wherein said rigid substrate is formed from a substrate wafer, the method further comprising the step of testing the die that is connected to said interposer while the rigid substrate that forms that interposer is part of said substrate wafer.

16. A method of integrated circuit packaging comprising the steps of:

providing an integrated circuit die having a top die surface, circuitry on said top die surface, and die array pads on said top die surface connected to said circuitry;

providing a leadframe having a plurality of bond fingers;

providing an interposer having a rigid substrate with a top substrate surface, interposer array pads arranged in a pattern on said top substrate surface for mating with said die array pads when said top die surface faces said top substrate surface, interposer bonding pads arranged about the periphery of said top substrate surface, and interposer routing lines for connecting said interposer array pads to said interposer bonding pads;

providing metal bumps for forming connections between said die array pads and said interposer array pads;

providing a housing;

electrically connecting said die array pads to said interposer array pads with said metal bumps;

electrically connecting said bond fingers and said interposer bonding pads by providing tape automated bonding tape and by bonding said tape automated bonding tape between said bond fingers and said interposer bonding pads; and encapsulating said die, said leadframe, said interposer, said bond, said metal bumps, and said bond fingers in said housing.

17. The method defined in claim 16 wherein said rigid substrate is formed from a substrate wafer, the method further comprising the step of testing the die that is connected to said interposer while the rigid substrate that forms that interposer is part of said substrate wafer.

* * * * *